United States Patent [19]
Yoshimura

[11] Patent Number: 4,734,647
[45] Date of Patent: Mar. 29, 1988

[54] NMR LOCAL COIL WITH FOIL COUPLING LOOP

[75] Inventor: Lou M. Yoshimura, Milwaukee, Wis.

[73] Assignee: Medical Advances, Inc., Wauwatosa, Wis.

[21] Appl. No.: 26,294

[22] Filed: Mar. 16, 1987

[51] Int. Cl.⁴ .................................... G01R 33/20
[52] U.S. Cl. ................................ 324/318; 333/230
[58] Field of Search ............... 324/307, 316, 318, 311, 324/315; 128/653; 333/219, 235, 230

[56] References Cited

U.S. PATENT DOCUMENTS 4,480,239 10/1984 Hyde et al. .................. 333/219
4,504,788 3/1985 Froncisz et al. .............. 324/316
4,623,835 11/1986 Mehdizadeh et al. .......... 324/316

Primary Examiner—Stewart J. Levy
Assistant Examiner—Kevin D. O'Shea
Attorney, Agent, or Firm—Quarles & Brady

[57] ABSTRACT

A local coil for NMR imaging includes a pair of loop-gap resonators which are mounted to a circular cylindrical insulating base. The NMR signal is coupled to a transmission line which terminates at a head connector that mounts to the base and which connects to a coupling loop formed by a conductive foil. The conductive foil forms a closed loop which is mounted to the base between the two loop-gap resonators and which follows the contour of the loops of the loop-gap resonators.

9 Claims, 7 Drawing Figures

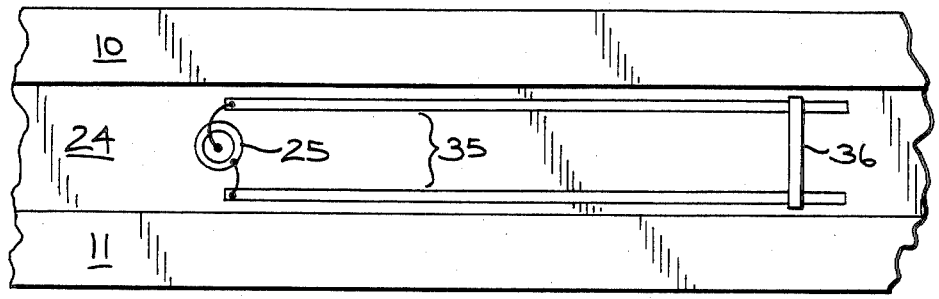
FIG. 5A
FIG. 5B
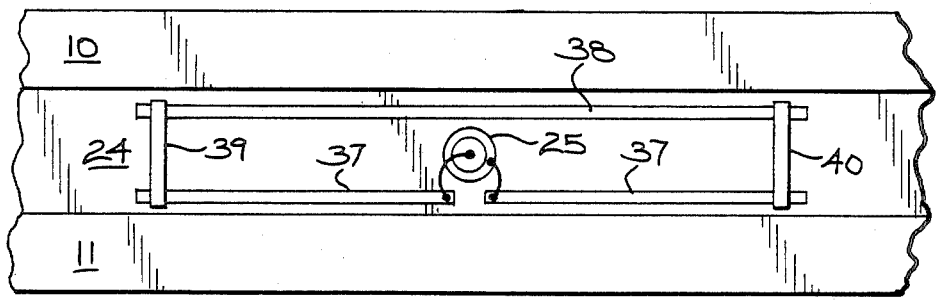
FIG. 5C
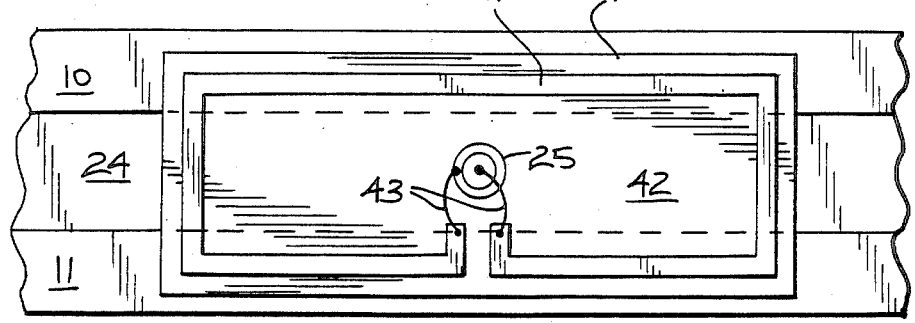

NMR LOCAL COIL WITH FOIL COUPLING LOOP

BACKGROUND OF THE INVENTION

The field of the invention is nuclear magnetic resonance imaging methods and systems. More particularly, the invention relates to a local coil which may be used to provide localized reception of the NMR signals produced in a whole body NMR scanner system or the like.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_z$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_1$, which is rotating, or spinning, in the x-y plane at the Larmor frequency. The degree to which the net magnetic moment $M_z$ is tipped, and hence, the magnitude of the net transverse magnetic moment $M_1$ depends primarily on the length of time and magnitude of the applied excitation field $B_1$.

The practical value of this phenomenon resides in the signal which is emitted by the excited spins after the excitation signal $B_1$ is terminated. In simple systems the excited spins induce an oscillating sine wave signal in a receiving coil. The frequency of this signal is the Larmor frequency, and its initial amplitude, $A_O$, is determined by the magnitude of the transverse magnetic moment $M_1$. The amplitude, A, of the emission signal decays in an exponential fashion with time, t:

$$A = A_o e^{t/T^*_2}$$

The decay constant $1/T^*_2$ depends on the homogeneity of the magnetic field and on $T_2$, which is referred to as the "spin-spin relaxation" constant, or the "transverse relaxation" constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. This is also called the longitudinal relaxation process as it describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements". Such NMR measurements are divided into a period of excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more excitation pulses ($B_1$) of varying magnitude and duration. Such excitation pulses may have a narrow frequency spectrum (selective excitation pulse), or they may have a broad frequency spectrum (nonselective excitation pulse) which produces transverse magnetization $M_1$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is subjected to a sequence of NMR measurement cycles which vary according to the particular localization method being used. The received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_O$, but which have a gradient along the respective x, y and z axes. By controlling the strength of these gradients during each NMR cycle, the spatial distribution of spin excitation can be controlled and the location of the NMR signals can be identified.

NMR has rapidly developed into an imaging modality which is utilized to obtain tomographic, projection and volumetric images of anatomical features of live human subjects. Such images depict the nuclear-spin distribution (typically protons associated with water and fat), modified by specific NMR properties of tissues, such as spin lattice ($T_1$), and spin-spin ($T_2$) relaxation time constants. They are of medical diagnostic value because they depict anatomy and allow tissue characterization.

The NMR scanners which implement these NMR techniques are constructed in a variety of sizes. Small, specially designed machines, are employed to examine laboratory animals or to provide images of specific parts of the human body. On the other hand, "whole body" NMR scanners are sufficiently large to receive an entire human body and produce an image of any portion thereof.

There are a number of techniques employed to produce the excitation field ($B_1$) and receive the NMR signal. The simplest and most commonly used structure is a single coil and associated tuning capacitor which serves to both produce the excitation signal and receive the resulting NMR signal. This resonant circuit is electronically switched between the excitation circuitry and the receiver circuitry during each measurement cycle. Such structures are quite commonly employed in both small NMR scanners and whole body NMR scanners.

It is also quite common to employ separate excitation coils and receiver coils. While such NMR scanners require additional hardware, the complexities of electronic switching associated with the use of a single coil are eliminated and specially designed coils may be employed for the excitation and receiver functions. For example, in whole body NMR scanners it is desirable to produce a circularly polarized excitation field ($B_1$) by using two pairs of coils which are orthogonally oriented, and which are driven with separate excitation signals that are phase shifted 90° with respect to each other. Such an excitation field is not possible with a single coil.

It is very difficult to construct a large coil which has both a uniform and high sensitivity to the NMR signal produced in a whole body NMR scanner. As a result, another commonly used technique is to employ "local" coils to either generate the excitation signal ($B_1$), receive the resulting NMR signal, or both generate and receive. Such local coils are relatively small and are constructed to produce the desired field or receive the NMR signal from a localized portion of the patient. For example, different local coils may be employed for imaging the head and neck, legs and arms, or various internal organs. When used as a receiver, the local coil should be designed to provide a relatively uniform sensitivity to the NMR signals produced by the spin throughout the region of interest.

Recently, a novel resonator structure, referred to in the art as a "loop-gap" resonator, has been applied as a local NMR coil. As indicated in U.S. Pat. Nos. 4,435,680; 4,446,429; 4,480,239 and 4,504,577, the loop-gap resonator may take a wide variety of shapes. In all cases, however, a lumped circuit resonator is formed in which a conductive loop is the inductive element and one or more gaps are formed in this loop to form a capacitive element. While the loop-gap resonator has many desirable characteristics normally associated with lumped circuit resonators, it also has some characteristics normally associated with cavity resonators. Most notable of these is the much higher quality factor, or "Q", of the loop-gap resonator over the traditional lumped circuit resonators. When applied to NMR scanners, this higher Q translates into higher resolution images.

Local receiver coils may be positioned in any orientation with respect to the generated excitation field ($B_1$) in order to receive the desired NMR signals. To prevent damage to the local coil (or receiver) and to prevent distortion of the excitation field ($B_1$), the local coil is designed to be intrinsically isolated from the uniform excitation field. This is accomplished by employing pairs of loop-gap resonators and connecting them together in such manner that they have little sensitivity to a uniform excitation field. Such local coils are described in co-pending U.S. patent application Ser. No. 731,923, filed on May 8, 1985, and entitled "Loop-gap Resonator for Localized NMR Imaging." To couple the NMR signal from such local coils, however, a "bifilar" coupling loop is commonly employed. Such a coupling loop connects to the transmission line which leads to the receiver input and it extends into the interior of the loop-gap resonator where it couples to the sensed NMR signal. Such coupling loops are expensive to manufacture because they must be precisely shaped and positioned in order to preserve the intrinsic isolation characteristic.

SUMMARY OF THE INVENTION

The present invention relates to a local coil for use in NMR imaging and, particularly, to a local coil which employs a pair of loop-gap resonators which are mounted adjacent to each other along a common axis and on a common cylindrical base. The present invention includes a coupling element having a head connector mounted to the base and positioned between the two loop-gap resonators, and a conductive wire, or foil, which electrically connects to a pair of terminals on the head connector and which extends in a path that is substantially coplanar with the loops of the pair of loop-gap resonators. The conductive foil may be formed directly on the base, between the loop-gap resonators, or it may overlap one or both of the loop-gap resonators with a suitable insulating layer therebetween. The path of the conductive foil may take a number of shapes, but a loop which is symetrically disposed to each side of the head connector is preferred.

A general object of the invention is to provide a coupling loop which is easily manufactured and which is sensitive to the NMR signal, but intrinsically isolated from the excitation field. The conductive foil can be formed on the base using the same process employed to form the loop-gap resonators, or it may be formed on a flexible substrate and bonded in place. In either case, the shape of the conductive foil may be easily and precisely controlled as well as its position with respect to the loop-gap resonators. It has been discovered that the coplanar mounting of the conductive foil between the two loop-gap resonators preserves intrinsic isolation of the local coil without any substantial reduction in sensitivity to the NMR signal.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIGS. 5A–5C are elevation views of alternative embodiments of the conductive foil construction which forms part of the local NMR coil of FIG. 4.

DESCRIPTION OF THE PREFERRED EMBODIMENT

Figure 1:
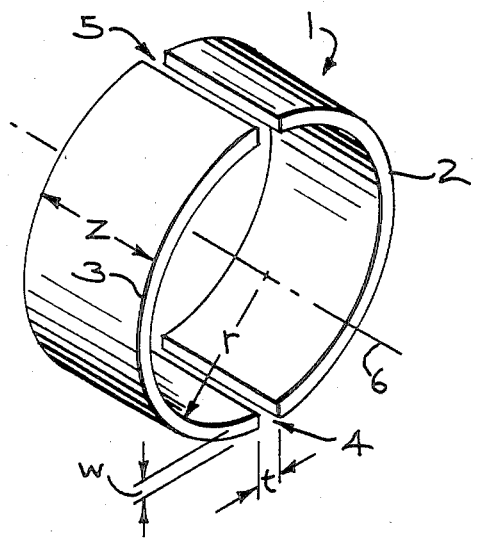
FIG. 1 is a perspective view of a loop-gap resonator which is employed in the present invention.

Referring particularly to FIG. 1, the loop-gap resonator 1 which is employed in the present invention is a lumped circuit resonator which resonates at a radio frequency determined by its geometry. The lumped circuit resonator 1 has dimensions which are much less than the wavelength of the radio frequency signal at which it resonates. The capacitive and inductive elements are identifiable and the electromagnetic field oscillates between a magnetic field generated by the inductive element and an electric field generated by the capacitive element.

The inductive element in the resonator 1 is the loop, or ring, formed by two metallic pieces 2 and 3, and the capacitive element is the longitudinal gaps 4 and 5 formed at the juncture of the two pieces 2 and 3. The magnetic field produced by the resonator 1 is concentrated along a central axis 6, and the electric field is concentrated in the gaps 4 and 5. The magnetic flux flows through the opening defined by the loop and curves radially outward at each of its ends and along the outside of the loop to form a closed flux path. The resonant frequency of the resonator 1 is determined primarily by its geometry, and it can be constructed to operate over a wide range of frequencies of interest. Where the spacing (t) in the gaps 4 and 5 is much smaller than their width (w), the resonant frequency of a loop-gap resonator is as follows:

$$F = \frac{1}{2\pi} \left( \frac{1}{LC} \right)^{\frac{1}{2}}$$

where: $L = \frac{\mu \pi r^2}{Z}$ $\frac{1}{C} = \sum_{m=1}^{n} \frac{t_m}{\epsilon W_m Z}$ $\epsilon$ = the dielectric constant of the material in the gaps;
$\mu$ = the permeability of free space;
n = the number of gaps, each having dimensions $t_m$ and $W_m$; and
z = the length of the resonator 1 in the direction of the central axis 6.

There are a number of characteristics of the loop-gap resonator which are important when applying them to practical use. First, the length (Z) has virtually no effect on the resonant frequency. Second, one or more gaps may be employed and these need not be of equal dimensions or provide equal capacitance. The loop need not be circular, although there are often advantages to a circular construction. And finally, energy may be applied or removed from the loop-gap resonator in either of two ways. Energy may be inductively coupled to or from the resonator by a conductive loop which encircles magnetic flux flowing through the loops and which connects to the end of a transmission line. Alternatively, energy can be capacitively coupled to or from the resonator by connecting the transmission line to the plates of one of the resonator's capacitive elements through an impedance matching network. The present invention pertains to a means for inductively coupling an NMR signal from the loop-gap resonator.

Figure 2:
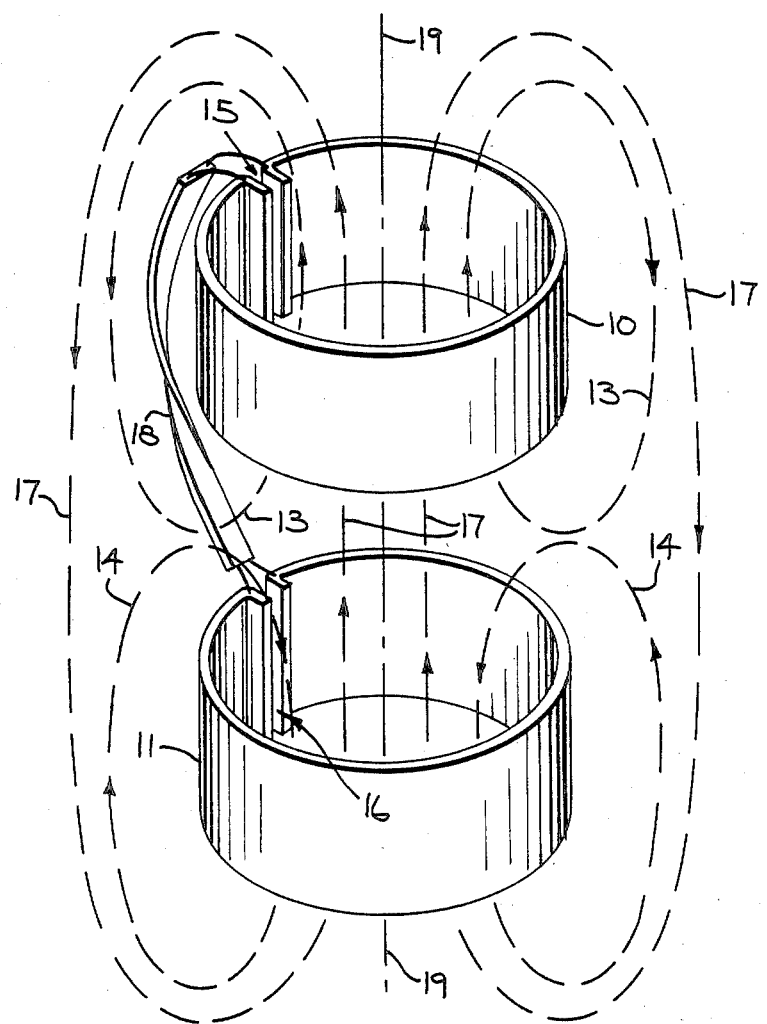
FIG. 2 is a perspective view of a pair of loop-gap resonators which are interconnected for use in the present invention.

Referring to FIG. 2, a local coil which uses the present invention employs two loop-gap resonators 10 and 11 which are spaced from one another and aligned along a common axis 19. When placed next to each other in this manner, the loop-gap resonators 10 and 11 will resonate in two modes. The first mode, referred to herein as the "unlinked" mode, is indicated by the dashed lines 13 and 14 which represent the paths of the magnetic flux flowing through each loop-gap resonator 10 and 11 in the opposite directions. The second resonant mode, referred to herein as the "linked" mode, is indicated by the dashed lines 17 which represent the paths of the magnetic flux flowing through each resonator 10 and 11 in the same direction. When the loop-gap resonators 10 and 11 are closely spaced, the frequency of each of these resonant modes is substantially different due to the mutual inductance.

To provide a local NMR probe which is intrinsically isolated from the excitation field, the linked mode is suppressed. This is accomplished by providing electrical cross-connections between the "plates" of the respective gaps 15 and 16 in the resonators 10 and 11. By forcing the electric potential to zero between opposite plates in the respective gaps 15 and 16, the linked resonant mode is suppressed and the field indicated by dashed line 17 is not produced. As a result, the coaxially aligned loop-gap resonators 10 and 11 are sensitive to locally produced NMR signals but are insensitive and substantially isolated from a uniform excitation field ($B_1$).

Figure 3:
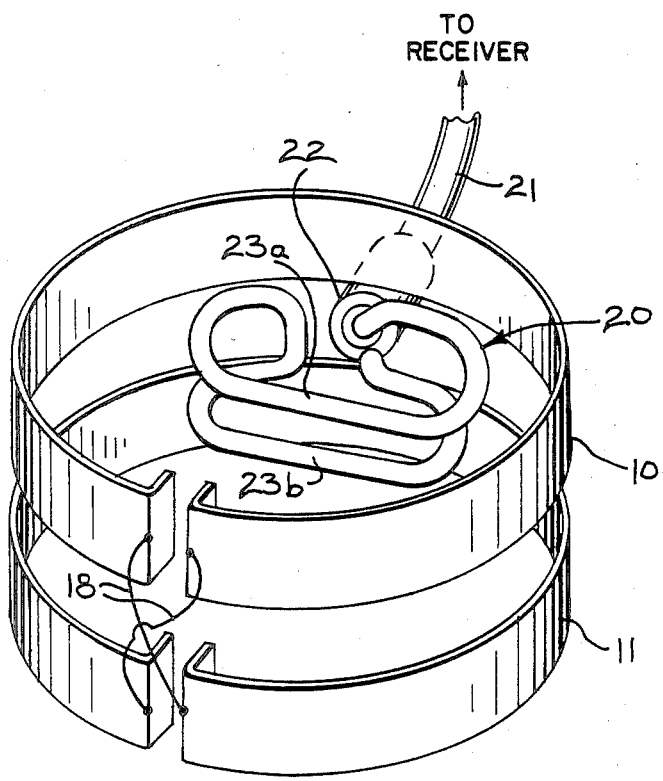
FIG. 3 is a perspective view of a prior art local NMR coil.

To extract an NMR signal from the coaxial pair of loop-gap resonators 10 and 11, a coupling loop is commonly employed. Such a coupling loop 20 is shown in FIG. 3 connected to a transmission line 21 which leads to the receiver of the NMR scanner system. The transmission line is terminated at a head connector 22 which mounts between the loop-gap resonators 10 and 11 and the ends of the coupling loop 20 connect to respective terminals on the head connector 22. The coupling loop 20 extends inward from the plane of the loop-gap resonators 10 and 11 and wraps around as shown. To maintain intrinsic isolation from the excitation field ($B_1$), this coupling loop 20 must be precisely shaped so that its upper and lower sections 23a and 23b are identical in shape and size and the loop is as symmetrical as possible. In addition, the size of the loop must be controlled so that it can be matched to the impedance of the transmission line 21. All of these factors have made it difficult and costly to manufacture a high quality NMR probe using the inductive coupling technique. The present invention overcomes these difficulties by providing a coupling loop construction which is easily manufactured and which retains the sensitivity and intrinsic isolation of prior structures.

Figure 4:
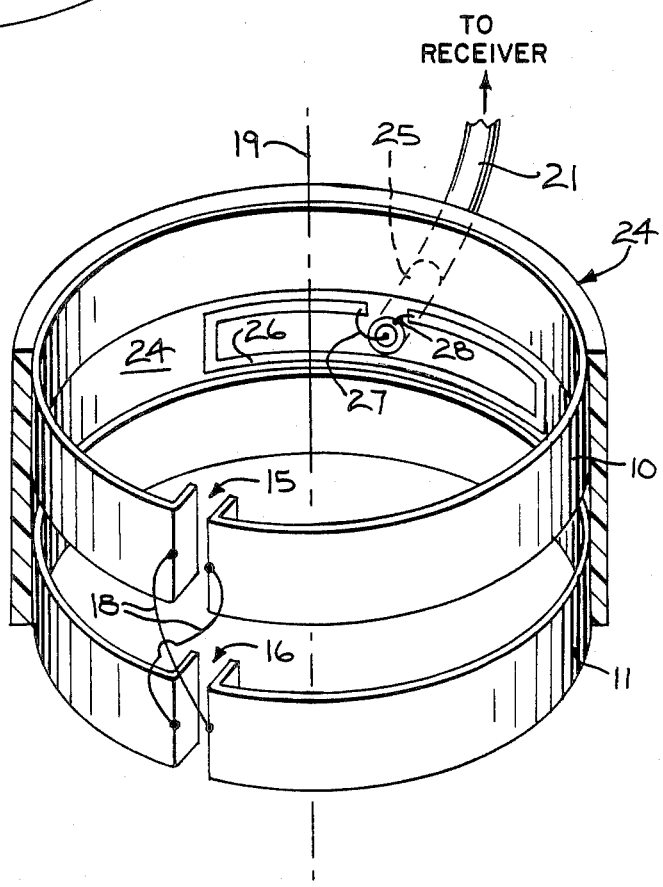
FIG. 4 is a perspective view with parts cut away of a first embodiment of the local NMR coil of the present invention.

A first preferred embodiment of the present invention is shown in FIG. 4. The two loop-gap resonators 10 and 11 are formed on the interior surface of a circular cylindrical insulating base 24, and arranged as described above to provide intrinsic isolation from the excitation field ($B_1$). The transmission line 21 is terminated at a head connector 25 which is mounted to the base 24 and which extends into the space between the two loop-gap resonators 10 and 11. A coupling loop is formed by a conductive foil 26 which mounts to the inner surface of the base 24, between the two loop-gap resonators 10 and 11. Indeed, the conductive foil 26 may be formed of the same material and may be formed in the same manner as the loop-gap resonator loops 10 and 11. For example, the base 24 may be the substrate of a flexible printed circuit board and the loops 10 and 11 along with the conductive foil 26 may be formed together in an etching process of the type used to produce printed circuits.

The conductive foil 26 may take a number of shapes, but in each case, a closed loop or coil is formed. In the embodiment shown in FIG. 4, the conductive foil 26 extends to each side of the head connector 25 and is symmetrical with respect to it. The conductive foil 26 lies totally within the space between the loop-gap resonators 10 and 11. The conductive foil 26 is formed on the same inner surface of the base 24 as the loops 10 and 11, and it is, therefore, coplanar with them. One end of the conductive foil 26 is connected by a wire 27 to the center terminal of the connector 25 and the other end connects to the outer terminal of the connector 25 by a wire 28.

The coupling coil thus formed has been found to be intrinsically isolated from the excitation field ($B_1$) and it has substantially the same sensitivity to an NMR signal as prior coupling coils which extend inward into the center region of the loop-gap resonator. This is a very surprising result in two respects. First, it is not apparent how a single conductive loop can be intrinsically isolated from the excitation field $B_1$, but it is when placed as described herein. And second, it is not apparent how a single loop which is rotated 90 degrees in space from prior coupling loops can be as sensitive to NMR signals, but it is when placed as described herein. It is believed that these results occur because the closed loop formed by the conductive foil 26 encircles magnetic flux flowing in the space between the loops 10 and 11 of the loop-gap resonators, but because of its co-planer orientation, it does not encircle magnetic flux flowing in the axial direction. Referring to FIG. 2 again, the coupling loop according to the present invention is, therefore, sensitive to magnetic flux 13 and 14 when the axial pair operate in their unlinked mode, but is insensitive to the linked mode flux 17.

The local probe of FIG. 4 may, of course, be constructed in a variety of sizes to operate at different frequencies. In the preferred embodiment each loop 10 and 11 has a radius of 3.0 inches and a width of 0.5 inches. They are spaced apart 0.5 inches and the entire probe thus has an axial length of 1.5 inches. The loops 10 and 11 are formed of sheet copper which is bonded to the inside wall of the circular cylindrical base 24. The gaps 15 and 16 are formed by bending the end portions of the sheet copper inward and separating them with an insulating material (not shown). These inward extending tabs are trimmed in size to tune the axial pair 10 and 11 to the resonant frequency of the spin, which, in the preferred embodiment, is 63.89 MHz. The base 24 is a section of commercially available polyvinyl chloride tubing.

The conductive foil 26 is formed by an etching process on a piece of flexible printed circuit board material. This is bonded to the base 24 in the position shown and the wires 27 and 28 are soldered in place. The conductive foil 26 defines an enclosed area having a "length" around the circumference of the probe of about 2.0 inches and a width in the axial direction of 0.5 inches. As will be explained in more detail below, the length of the resulting coil may be adjusted to tune it to the transmission line 21.

Referring particularly to FIG. 5A, it is not necessary that the conductive foil be positioned symmetrically about the head connector 25. In this second embodiment, the conductive foil is formed by a pair of conductive arms 35 which extend parallel to one another in one direction from the head connector 25. Each arm 35 is connected to a respective one of the terminals on the head connector 25 and a shorting bar 36 is soldered to each arm 35 near its outer end. The position of the shorting bar 36 may be adjusted to alter its length and hence the impedance of the resulting loop. In this manner, the impedance of the loop can be precisely matched to that of the transmission line 21.

Referring to FIG. 5B, the ability to tune the coupling loop may also be accomplished in a symmetrical construction. In this third embodiment, the conductive foil is formed by a pair of arms 37 which extend in opposite directions from the head connector 25 and a parallel bar 38 which extends the entire length of the two arms 37. The inner end of each arm 37 connects to a respective one of the terminals on the head connector 25, and their outer ends are connected to the bar 38 by respective shorting bars 39 and 40. The shorting bars 39 and 40 can be adjusted in position to tune the loop to the impedance of the transmission line 21 while maintaining symmetry about the head connector 25. When the proper position is found, the shorting bars 39 and 40 are soldered in place.

Referring particularly to FIG. 5C, it is not necessary that the conductive foil be disposed totally between the two loop-gap resonators 10 and 11. In this third embodiment the conductive foil is formed as a symmetrical loop 41 on an insulating substrate 42. A hole is formed in the center of the substrate 42 to enable the head connector 25 to protrude through, and the substrate is bonded in place to the interior of the base 24 and loop 10 and 11. Lead wires 43 connect the terminals on the head connector 25 to the ends of the symmetrical loop 41. In this third embodiment the symmetrical loop 41 overlaps the loop-gap resonators 10 and 11, but the substrate 42 is disposed therebetween to provide electrical insulation. It should be apparent that this same construction can also be achieved by forming the symmetrical loop 41 and the loop-gap resonators 10 and 11 on the opposite surfaces of a two-sided flexible printed circuit board. In such case, the flexible printed circuit board is curled into a cylindrical shape and then bonded to the inner surface of the supporting base 24. The substrate of the printed circuit serves to insulate the loop 41 from the loop-gap resonators 10 and 11.

Many variations from the preferred embodiments described above are possible without departing from the spirit of the invention. For example, while the base 24 has a circular cylindrical shape in the preferred embodiments, other shapes are possible. Regardless of its shape and the consequent shape of the loops 10 and 11 of the loop-gap resonators, an important factor is that the plane(s) in which the closed path formed by the conductive foil 26 lies substantially in the same plane(s) of the loops 10 and 11. In other words, the conductive foil 26 is substantially coplanar with the loops 10 and 11 regardless of how they are shaped. As indicated by the preferred embodiments described above, the conductive foil 26 may be formed on the same surface as the loops 10 and 11 and thus be exactly coplanar therewith, or the conductive foil 26 may be offset by an insulating layer and be substantially coplanar with the loops 10 and 11.

I claim:

1. In a local coil for use in NMR imaging which includes a pair of loop-gap resonators that are positioned adjacent to each other along a common axis and the loops thereof are mounted in spaced relationship on a common cylindrical base that encircles the common axis, the improvement therein comprising:

a head connector mounted to the base and having a pair of terminals which connect to leads in a transmission line; and a conductive path supported by the base and having two ends which electrically connect to the respective terminals on the head connector, the conductive path extending in a closed path that is substantially coplanar with the loops of the pair of loop-gap resonators and which encircles a portion of the space between the loops of the pair of loop-gap resonators.

2. The improvement as recited in claim 1 in which the conductive path is mounted directly on a surface of the common cylindrical base and the conductive path is positioned between the pair of loop-gap resonators.

3. The improvement as recited in claim 1 in which the closed path formed by the conductive path extends symmetrically in both circumferential directions from its two ends.

4. The improvement as recited in claim 1 in which the conductive path is formed on an insulating substrate which is mounted to the common cylindrical base.

5. The improvement as recited in claim 1 in which a portion of the conductive path is physically adjustable such that the area enclosed by the closed path may be adjusted to alter the impedance thereof.

6. A local coil for use in NMR measurements, the combination comprising:

a pair of loop-gap resonators that are positioned adjacent to each other with their respective loops encircling a common central axis and being spaced apart to define a space between the respective loops through which magnetic flux flows when the pair of loop-gap resonators operate in their unlinked mode;

a transmission line for connecting the local coil to an NMR system; and a conductive path which forms a closed loop that connects to the transmission line for inductively coupling an NMR signal from the local coil to the NMR system, the conductive path being positioned to encircle magnetic flux which follows through said space between the respective loops, and being oriented such that it does not encircle magnetic flux which flows in the direction of the common central axis when the pair of loop-gap resonators operate in their linked mode.

7. The local coil as recited in claim 6 in which the respective loops of the loop-gap resonators and the conductive path are mounted to a cylindrical base.

8. The local coil as recited in claim 6 in which the conductive path is substantially coplanar with the loops of the loop-gap resonators.

9. The local coil as recited in claim 6 in which the size of the closed loop formed by the conductive path may be adjusted to match the impedance of the closed loop to that of the transmission line.

* * * * *